United States Patent
Vilhonen

(10) Patent No.: US 8,041,314 B2
(45) Date of Patent: Oct. 18, 2011

(54) SIGNAL AMPLIFIER STRUCTURE FOR RADIO TRANSMITTER

(75) Inventor: Sami Vilhonen, Littoinen (FI)

(73) Assignee: Nokia Corporation, Espoo (FI)

( * ) Notice: Subject to any disclaimer, the term of this patent is extended or adjusted under 35 U.S.C. 154(b) by 906 days.

(21) Appl. No.: 11/907,071

(22) Filed: Oct. 9, 2007

(65) Prior Publication Data

US 2009/0054017 A1    Feb. 26, 2009

(30) Foreign Application Priority Data

Aug. 24, 2007 (FI) .................................. 20075586

(51) Int. Cl.
*H04B 1/04* (2006.01)
(52) U.S. Cl. ....... 455/118; 455/73; 455/131; 455/127.2; 455/127.3; 455/114.3; 330/133; 330/295; 330/296
(58) Field of Classification Search .................. 455/118, 455/73, 131, 127.2, 127.3, 114.3; 330/133, 330/295, 296
See application file for complete search history.

(56) References Cited

U.S. PATENT DOCUMENTS

| | | | | |
|---|---|---|---|---|
| 5,872,481 A * | 2/1999 | Sevic et al. | ..................... | 330/51 |
| 6,137,355 A * | 10/2000 | Sevic et al. | ..................... | 330/51 |
| 6,320,913 B1 * | 11/2001 | Nakayama | ..................... | 375/297 |
| 6,593,827 B2 * | 7/2003 | Chethik et al. | ................ | 332/103 |
| 7,672,650 B2 * | 3/2010 | Sorrells et al. | ............. | 455/127.3 |
| 7,715,461 B2 * | 5/2010 | Odenwalder | ................ | 375/146 |
| 7,751,496 B2 * | 7/2010 | Ahmed | ......................... | 375/297 |

FOREIGN PATENT DOCUMENTS

GB       2 326 782 A       12/1998
WO       WO 97/24800      7/1997

* cited by examiner

*Primary Examiner* — Sanh Phu
(74) *Attorney, Agent, or Firm* — Squire, Sanders & Dempsey LLP

(57) ABSTRACT

There is provided a modular amplifier structure that includes a plurality of parallel amplifier sub-units. Each amplifier sub-unit is configured to amplify a received payload signal under control of at least one received control signal. Outputs of the amplifier sub-units are applied to a combining circuit. The combining circuit is configured to combine the outputs of the plurality of amplifier sub-units to provide an amplified payload signal.

21 Claims, 2 Drawing Sheets

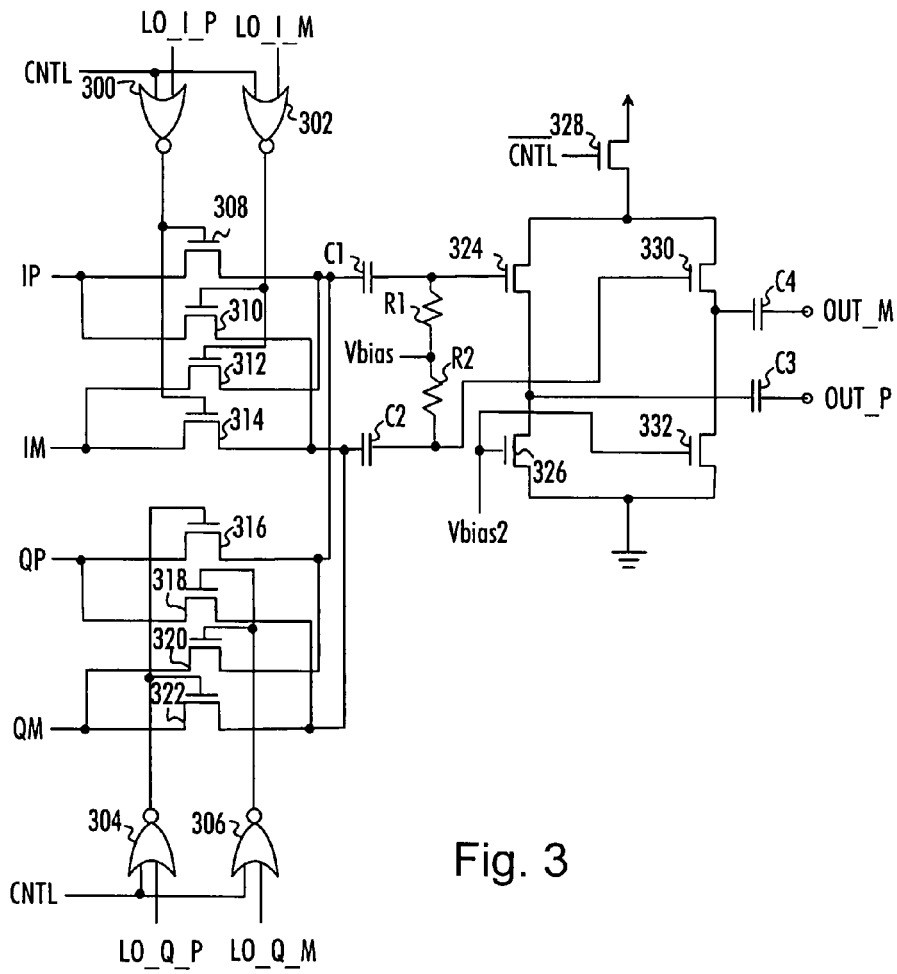
Fig. 3
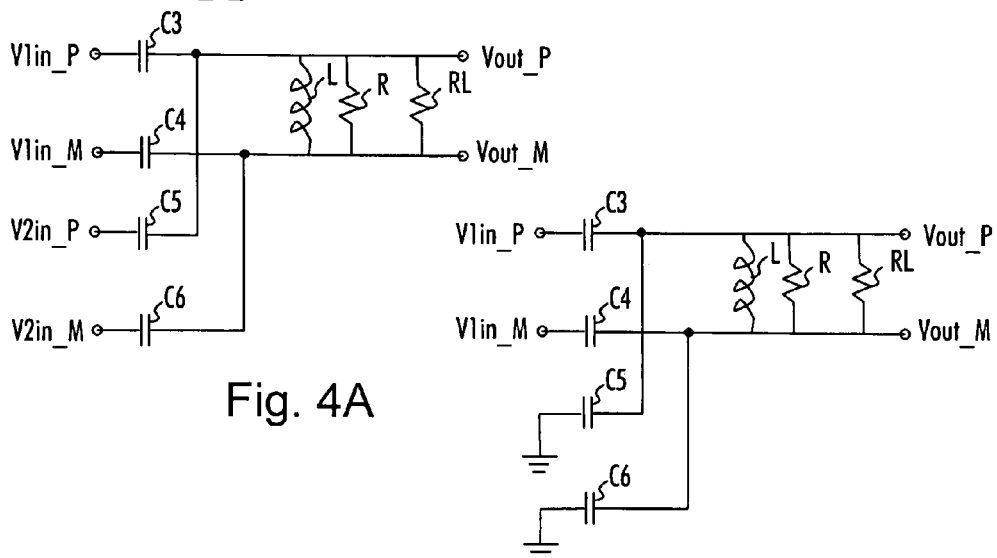
Fig. 4A
Fig. 4B

SIGNAL AMPLIFIER STRUCTURE FOR RADIO TRANSMITTER

FIELD

The invention relates to amplification of signals in a radio transmitter.

BACKGROUND

In radio transmitters, a transmission signal, i.e. the signal being transmitted, has to be amplified in to a level suitable for transmission over an air interface to a radio receiver. The level of the amplified transmission signal should be high enough to enable the radio receiver to decode information contained in the transmission signal.

CMOS (Complementary metal-oxide-semiconductor) transistors have been widely used in amplifiers implemented as integrated circuits. Advantages of the CMOS transistors over, for example, bipolar junction transistors (BJT) are obvious to one skilled in the art. Typical disadvantages of CMOS transistors in comparison with BJTs include, however, lower trans-conductance, lower breakdown voltage, limited performance of passive components in CMOS process, and lower isolation. A lower trans-conductance leads to a higher current consumption in an amplifier, a lower breakdown may result in a low power supply and, as a consequence, in a limited swing at an output of the amplifier. A limited passive component performance leads to lower integration level and designs that avoid use of resistors, for example. Lower isolation makes it harder to design a wide and accurate power tuning range. Consequently, there are problems in using CMOS transistors in amplifiers that must be accounted for.

BRIEF DESCRIPTION

An object of the present invention is to provide an improved solution for performing amplification and frequency conversion for signals to be transmitted from a radio transceiver.

According to an aspect of the invention, there are provided apparatuses as specified in independent claims 1 and 26.

According to another aspect of the invention, there is provided a method as specified in independent claim 14.

According to yet another aspect of the invention, there is provided a radio transceiver as specified in independent claim 13.

Embodiments of the invention are defined in the dependent claims.

LIST OF DRAWINGS

Embodiments of the present invention are described below, by way of example only, with reference to the accompanying drawings, in which FIG. 1 illustrates a block diagram of a radio transmitter;

FIG. 3 illustrates a detailed diagram of an amplifier sub-unit according to an embodiment of the invention;

FIGS. 4A and 4B illustrate diagrams of a combining circuit according to an embodiment of the invention in two states.

DESCRIPTION OF EMBODIMENTS

The following embodiments are exemplary. Although the specification may refer to "an", "one", or "some" embodiment(s) in several locations, this does not necessarily mean that each such reference is made to the same embodiment(s), or that a feature only applies to a single embodiment. Single features of different embodiments may also be combined to provide other embodiments.

Figure 1:
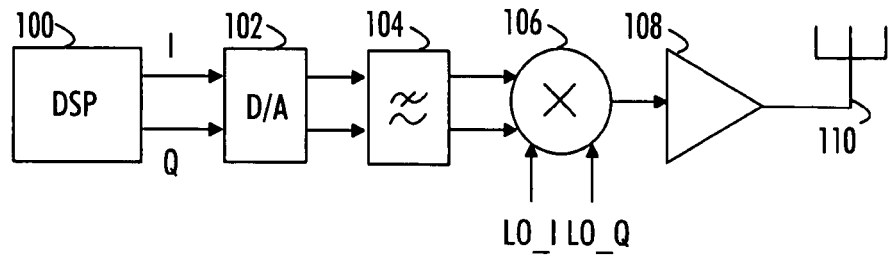

FIG. 1 illustrates a simplified block diagram of a radio transmitter structure in which embodiments of the invention may be implemented. The transmitter structure comprises one or more digital signal processors (DSP) 100 performing digital processing on a signal to be transmitted from the transmitter. The DSP part 100 of the transmitter may produce a payload signal including an in-phase (I) signal component and a quadrature (Q) signal component. The payload signal refers to an actual information signal transmitted from the transmitter. The I and the Q signals are then fed to a digital-to-analog (D/A) converter 102 for conversion into analog signals. The D/A converted analog I and Q signals are then filtered in a low-pass filter to remove undesired quantization noise and spurious high-frequency signal components which may be included in the signals as a result of the D/A conversion. The low-pass filter 104 may be a simple raised-cosine filter, for example.

Then, the low-pass filtered I and Q signals are fed to an up-converter (frequency mixer) 106 performing up-conversion on the signals. In other words, the up-converter 106 converts the I and Q signals from a baseband to a radio frequency (RF) band by multiplying the I signal and the Q signal by local oscillator signals LO_I and LO_Q, respectively. The local oscillator signals may be the same local oscillator signals but they have a 90 degree phase difference. As a consequence, radio frequency I and Q signals resulting from the up-conversion have the same 90 degree phase difference between them. Additionally, the up-converter 106 may combine the I and the Q signal. The up-converter may be either an active or passive frequency mixer.

The up-converted and combined signal is then applied to a power amplifier 108 amplifying the signal for transmission. Then, the power-amplified signal is transmitted as a radio signal through an antenna 110 to an air interface.

Figure 2:
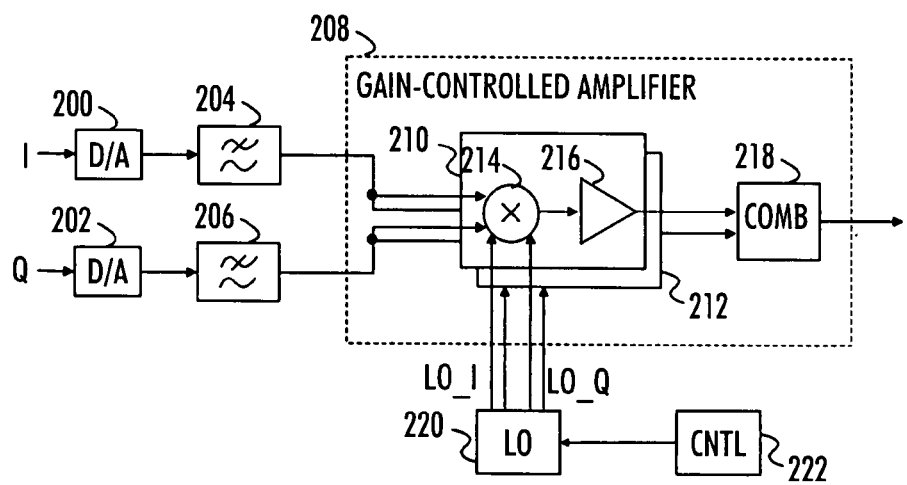
FIG. 2 illustrates a block diagram including a modular amplifier structure according to an embodiment of the invention.

FIG. 2 illustrates a gain-controlled amplifier 208 according to an embodiment of the invention. An I component of a payload signal is D/A converted in a first D/A converter 202 and low-pass filtered in a first low-pass filter 204. Similarly, a Q component of the payload signal is D/A converted in a second D/A converter 200 and low-pass filtered in a second low-pass filter 206. The first and the second D/A converter 200 and 202 may together correspond to the D/A converter 102 illustrated in FIG. 1, and the first and the second low-pass filter may together correspond to the low-pass filter 104.

Then, the payload signal is applied to an interface of the gain-controlled amplifier 208. Additionally, the gain-controlled amplifier 208 receives control signals controlling the operation of the gain-controlled amplifier 208. The gain-controlled amplifier 208 may receive local oscillator signals LO_I and LO_Q as control signals. The local oscillator signals LO_I and LO_Q may be generated by a local oscillator signal generator 220 controlled by a controller 222. Controlling the generation and, particularly, input of the local oscillator signals to the gain-controlled amplifier 208 will be described in more detail below. The controller may be a digital signal processor configured by suitable software including instructions for executing a computer process for controlling amplification of the modular amplifier structure 208. The software may be embodied on a computer-readable medium.

The interface of the gain-controlled amplifier may distribute the payload signals and the control signals to a modular amplifier structure of the gain-controlled amplifier 208. The modular amplifier structure in the example of FIG. 2 includes amplifier sub-units 210 and 212 performing both up-conversion and amplification operations. The interface may distribute a received payload signal to payload-signal inputs of the amplifier sub-units 210 and 212. Additionally, the interface may distribute the local oscillator signals LO_I and LO_Q to control-signal inputs of the amplifier sub-units 210 and 212.

Each amplifier sub-unit 210 and 212 is configured to amplify the received payload signal under control of at least one received control signal. In this example, the control signal is a received oscillator signal. Each amplifier sub-unit 210 and 212 may comprise an up-converter part 214 and an amplifier part 216. The up-converter part 214 may perform the up-conversion from one frequency to another, higher frequency (RF frequency), and the amplifier part 216 may amplify the up-converted signal. In other words, both amplifier sub-units 210 and 212 may up-convert and amplify the received payload signal, each amplifier sub-unit 210 and 212 thereby producing an up-converted and amplified output signal. The up-converters, i.e. frequency converters, may be configured to process signals from the same first frequency band to the same second frequency band. In other words, the up-converters may all convert the payload signal to the same frequency band. The configuration may be implemented by applying to the frequency converters oscillator signals having the same frequency.

The up-converted and amplified output signals produced by the amplifier sub-units 210 and 212 are fed to a combiner 218 configured to combine the signals in order to produce a combined output signal. When combined appropriately, an amplification factor of the combined output signal is a superposition of the amplification factors of the amplifier sub-units 210 and 212.

In practice, the control signals may be used to activate or disable amplifier sub-units 210 and 212, thereby controlling an amplification factor of the gain-controlled amplifier 208. In fact, a given amplifier sub-unit 210 or 212 may be activated by applying the oscillator signal to the amplifier sub-unit. On the other hand, the amplifier sub-unit may be disabled by preventing the input of the oscillator signal to the amplifier sub-unit. Accordingly, the amplification factor of the gain-controlled amplifier may be adjusted by selectively activating/disabling amplifier sub-units 208 of the gain-controlled amplifier 208 having a modular structure, as described above. The selection of the amplifier sub-units 210 and 212 may be determined by the controller 222. It should be noted that the number of amplifier sub-units may depend on the actual implementation.

For the sake of simplicity, FIG. 2 illustrates only two amplifier sub-units 210 and 212, and the actual number of amplifier sub-units may be higher than two. Moreover, the gain-controller amplifier according to an embodiment of the invention has been described above in the context of a radio transmitter. The gain-controller amplifier according to the embodiment of the invention is, however, equally applicable to radio receivers, radio transceivers, and other corresponding applications.

FIG. 3 illustrates a detailed diagram of an amplifier sub-unit according to an embodiment of the invention. As illustrated in FIG. 2, the amplifier sub-unit may include a frequency mixer part and an amplifier part. In the embodiment illustrated in FIG. 3, components on the left-hand side as seen from capacitors C1 and C2 constitute the frequency mixer part, and components on the right-hand side as seen from capacitors C1 and C2 constitute the amplifier part. The capacitors C1 and C2 prevent a bias voltage Vbias of the amplifier part from leaking to the frequency mixer part.

In the embodiment illustrated in FIG. 3, both I and Q components of the payload signal are input to the amplifier sub-unit in a differential mode, wherein signals IP and IM represent the I component and QP and QM represent the Q component of the payload signal. Signal IP is coupled from the input of the amplifier sub-unit to source electrodes of a first CMOS (Complementary metal-oxide-semiconductor) transistor 308 and a second CMOS transistor 310, while the signal IM is applied to source electrodes of a third and a fourth CMOS transistors 312 and 314. Drain electrodes of the first and the third CMOS transistors 308 and 312 are coupled together, as are drain electrodes of the second and the fourth CMOS transistors 308 and 314. CMOS transistors 310 to 314 form an in-phase part of the frequency mixer, configured to up-convert the I component of the payload signal.

An in-phase oscillator signal LO_I provided by a local oscillator signal generator in the differential mode is applied to gates of the first to fourth CMOS transistors 308 to 314. A positive component LO_I_P of the in-phase oscillator signal is coupled to gates of the first and the fourth transistor 308 and 314, while a negative component LO_I_M of the in-phase oscillator signal is coupled to gates of the second and the third transistor 310 and 312. The positive and the negative components of the in-phase oscillator signal are coupled to gates of the transistors 308 to 314 through logic NOR gates 300 and 302, respectively, and the NOR gates 300 and 302 receive a control signal CNTL as another input. The control signal CNTL may be provided by the controller 222 illustrated in FIG. 2.

The control signal CNTL is used to control coupling of the oscillator signals LO_I_P and LO_I_M (and corresponding quadrature oscillator signals LO_Q_P and LO_Q_M) to the frequency mixers, thereby activating or disabling the frequency mixer part and, as a consequence, the amplifier sub-unit. According to a truth table of the logic NOR gates 300, 302, 304, and 306, an oscillator signal at the other input of a given NOR gate is coupled to the frequency mixer part when the control signal is 0, and the oscillator signal is disconnected from the frequency mixer part when the control signal is 1. It should be noted that the coupling of the oscillator signals to the frequency mixer part may be implemented in other ways, e.g. with switches controlled by the control signal.

The NOR gates 300 to 306 may be included in the amplifier sub-unit, in which case the amplifier sub-unit receives the oscillator signals and the control signal CNTL as control signals. Alternatively, the NOR gates 300 to 306 may be included in the local oscillator signal generator 220, in which case the amplifier sub-unit may receive only the oscillator signals as control signals. In the latter case, the controller 222 controls the local oscillator signal generator 220 to input the local oscillator signals to the amplifier sub-unit according to an embodiment of the invention.

As indicated above, the first to fourth transistors 308 to 314 form the in-phase part of the frequency mixer. Similarly, transistors 316, 318, 320, and 322 form a quadrature part of the frequency mixer. A positive component of the Q signal (QP) is coupled from the input of the amplifier sub-unit to source electrodes of the fifth CMOS transistor 316 and the sixth CMOS transistor 318, while a negative component of the Q signal (QM) is applied to source electrodes of the seventh and the eighth CMOS transistors 320 and 322. Drain electrodes of the fifth and the seventh CMOS transistors 316 and 320 are coupled together, as are drain electrodes of the sixth and the eighth CMOS transistors 318 and 322. As a consequence, the CMOS transistors 316 to 322 are configured to up-convert the Q component of the payload signal.

A quadrature oscillator signal LO_Q provided by a local oscillator in the differential mode is applied to gates of the fifth to eighth CMOS transistors 316 to 322. A positive component LO_Q_P of the quadrature oscillator signal is coupled to gates of the fifth and the eighth transistors 316 and 322, while a negative component LO_Q_M of the quadrature oscillator signal is coupled to gates of the sixth and the seventh transistors 318 and 320. The positive and the negative components of the quadrature oscillator signal are coupled to gates of the transistors 316 to 322 through the logic NOR gates 304 and 306 having a control signal CNTL as another input.

The differential-mode up-converted I and Q component of the payload signal may be combined by coupling drain electrodes of the transistors 308, 312, 316, and 320 together, thereby forming a positive component of the payload signal including positive components of both I and Q components of the payload signal. Similarly, drain electrodes of the transistors 310, 314, 318, and 322 may be coupled together, thereby forming a negative component of the payload signal including negative components of both I and Q components of the payload signal.

The frequency mixer illustrated in FIG. 3 has been implemented by a CMOS bridge in which the CMOS transistors 308 to 322 operate as switches according to their gate voltages defined by the oscillator signals. In this example, the CMOS transistors 308 to 322 may be n-type transistors. Accordingly, the transistors 308 to 322 do not conduct when no oscillator signal is coupled to the gates of the transistors.

The up-converted payload signal may be coupled to the amplifier part through the capacitors C1 and C2. To be exact, the positive component of the payload signal may be coupled through a first capacitor C1 and the negative component of the payload signal may be coupled through a second capacitor C2. At one end, the first capacitor C1 is coupled to a gate of a first amplifier CMOS transistor 324, while the second capacitor C2 is coupled to a gate of a second amplifier CMOS transistor 330. Additionally, the bias voltage Vbias is applied to the gates of the first and the second amplifier transistors 324 and 330 through a first and a second resistor R1 and R2, respectively. The resistors R1 and R2 may be coupled in series (with respect to each other) between the positive and negative signal path of the payload signal, and the bias voltage Vbias may be applied to a point between the resistors R1 and R2. The bias voltage Vbias may ensure that the first and the second amplifier transistors 324 and 330 conduct all the time.

The amplifier part further comprises a third amplifier transistor 326, fourth amplifier transistor 332, and a fifth amplifier transistor 328. A second bias voltage Vbias2 is applied to gates of the third and the fourth amplifier transistors 326 and 332 to ensure that they remain in a conductive state. The fifth transistor 328 receives a complemented control signal CNTL at its gate electrode, thereby controlling the operation of the amplifier part. Source electrodes of the third and the fourth amplifier transistors 326 and 332 may be coupled to the ground, and drain electrodes of the third and the fourth amplifier transistors 326 and 332 may be coupled to source electrodes of the first and the second amplifier transistors 324 and 330, respectively. Drain electrodes of the first and the second amplifier transistors 324 and 330 may be connected to a source electrode of the fifth amplifier transistor 328, and the drain electrode of the fifth amplifier transistor 328 may be connected to an operating voltage. In other words, the first and the third amplifier transistors 324 and 326 are coupled in parallel with the second and the fourth amplifier transistors 330 and 332 between the operating voltage and the ground. The fifth amplifier transistor 328 is arranged in series with the other amplifier transistors 324, 326, 330, 332 between the operating voltage and the ground to control the current flow in the amplifier part of the amplifier sub-unit. The amplifier transistors 324 to 332 are n-type CMOS transistors in this example.

An output signal of the amplifier sub-unit may be obtained from a point between the transistors 324; 326 and/or 330; 332. In more detail, a negative component of an amplified payload signal may be obtained between the second and the fourth amplifier transistors 330 and 332, i.e. from a point between the source electrode of the second amplifier transistor 330 and the drain electrode of the fourth amplifier transistor 332. Similarly, a positive component of an amplified payload signal may be obtained between the first and the third amplifier transistors 324 and 326, i.e. from a point between the source electrode of the first amplifier transistor 324 and the drain electrode of the third amplifier transistor 326.

Let us consider the operation of the amplifier part in more detail. As described above, the operation of the amplifier part is controlled by the control signal applied to the gate electrode of the fifth amplifier transistor 328. The control signal applied to the gate electrode of the fifth amplifier transistor 328 is a complement of the control signal CNTL applied to the inputs of the NOR gates 300 to 306. Let us assume that the oscillator signals LO_I_P, LO_I_M, LO_Q_P, and LO_Q_M are coupled to the frequency mixer part by setting the control signal CNTL to a logic value zero (0). Accordingly, the frequency mixer part of the amplifier sub-unit performs the up-conversion on the received signals IP, IM, QP, and QM and couples the up-converted payload signals to the amplifier part. Since the control signal CNTL has the logic value zero (0), its complement value input to the gate electrode of the fifth amplifier transistor 328 is a logic level one (1), i.e. positive voltage. As a consequence, the fifth amplifier transistor is in a conducting state and couples the operating voltage through the fifth amplifier transistor 328 to the other amplifier transistors 324, 326, 330, and 330 and causes amplification of the up-converted payload signals in the amplifier transistors 324, 326, 330, and 330. Accordingly, an up-converted and amplified payload signal is fed to the output ports of the amplifier sub-unit. In this way, the amplifier sub-unit is activated with the control signal CNTL and operates under control of the controller 222.

On the other hand, let us assume that the oscillator signals LO_I_P, LO_I_M, LO_Q_P, and LO_Q_M are disconnected from the frequency mixer part by setting the control signal CNTL to a logic value one (1). Accordingly, an output of the NOR gates remains zero regardless of the value of the oscillator signals, and the oscillator signals are effectively disconnected from the frequency mixer part of the amplifier sub-unit. As a consequence, transistors of the frequency mixer part remain in a non-conductive state. Additionally, a complement of the control signal is now zero (0) and, thereby, the fifth amplifier transistor 328 is also in the non-conductive state disconnecting the other amplifier transistors 324, 326, 330, and 332 from the operating voltage. Since the second and the fourth amplifier transistors 326 and 332 remain in the conductive state because of the bias voltages applied to their gate electrodes, outputs of the amplifier sub-unit are effectively connected to the ground in this state. In this way, the amplifier sub-unit is effectively disabled with the control signal CNTL under control of the controller 222.

Capacitors C3 and C4 may be provided at the output of the amplifier sub-unit. The capacitors may be considered as a part of the amplifier sub-unit but also as a part of the combining circuit, as becomes evident from the description below. The capacitor C3 may be provided on the positive signal path, while the capacitor C4 may be provided on the negative signal path.

As illustrated in FIG. 2, outputs of the amplifier sub-units 210, 212 may be connected to an input of the combining circuit 218. FIGS. 4A and 4B illustrate an embodiment of the combining circuit 218 in two states. Let us first consider FIG. 4A. Also in this case, the combining circuit 218 receives inputs from two amplifier sub-units, but the number of amplifier sub-units may be higher in practice. Signal V1 provided in the differential mode and including a positive component V1in_P and a negative component V1in_M is received from the amplifier sub-unit illustrated in FIG. 3 through the capacitors C3 and C4. Similarly, a signal V2 (components V2in_P and V2in_M) is received from another amplifier sub-unit through the capacitors C5 and C6. The capacitor C5 may be coupled to the capacitor C3 in order to combine the positive components of the two input signals V1 and V2. In a similar way, the capacitor C6 may be coupled to the capacitor C4 to combine the negative components of the two input signals V1 and V2. The points at which the capacitors are connected to each other may reside between the capacitors C3 to C6 and an output port of the combining circuit.

While preventing a DC (direct current) connection between the amplifier sub-units and the combining circuit, the capacitors C3 to C6 in conjunction with a coil L function as a series resonance circuit, thereby effectively combining the received signals V1 and V2 and providing a voltage gain significantly higher than that provided by a single amplifier sub-unit. The coil L may be coupled between the positive and the negative signal paths, i.e. the coil may connect the signal paths together at points between the capacitors C3 to C6 and at the output port of the combining circuit. A combined output signal Vout including a positive component Vout_P and a negative component Vout_M is then applied to a load resistor RL representing an output load element of the combining circuit. A resistor R connected in parallel with the coil L is not necessarily needed, but it may be used to tune the output load of the circuit.

In the state illustrated in FIG. 4A, both amplifier sub-units are activated and, therefore, their outputs are combined in the combining circuit. In the state illustrated in FIG. 4B, one of the amplifier sub-units has been disabled and, as a consequence, the capacitors C5 and C6 are connected to the ground from the side of amplifier sub-unit. As mentioned above, the amplifier part of the amplifier sub-unit effectively grounds the output when the amplifier sub-unit is disabled. As a consequence, only the output signal of the activated amplifier sub-unit is coupled to the output of the combining circuit.

In this embodiment, an output impedance of the combining circuit may be maintained regardless of the number of activated and/or disabled amplifier sub-units. As can be seen from FIGS. 4A and 4B, a change in output power is a function of the number of activated amplifier sub-units but also a function of the capacitance ratios of the capacitors C1 to C4. In a modern CMOS process, the capacitance ratios may be accurately controlled to avoid the effect of a disabled amplifier sub-unit on the output power. Therefore, only output power is affected as a function of the number of activated amplifier sub-units.

Isolation requirements are also low because a disabled amplitude sub-unit does not output signals which could cause a signal leakage. Additionally, power consumption of the disabled amplifier sub-units is minimal, resulting in a low power consumption of the modular amplifier structure according to the embodiment of the invention. Moreover, the gain-controlled amplifier may be designed to avoid the need for excessive use of passive components.

The amplifier sub-units provided in the modular amplifier according to an embodiment of the invention may be identical but they may also differ from each other in topology and amplification capabilities in terms of their capability to amplify the payload signal. According to another embodiment, the amplification factor of at least some of the amplifier sub-units is controlled by binary weighting. A binary-weighted amplifier sub-unit may include a plurality of amplifier parts similar to the one illustrated in FIG. 3, wherein each amplifier part is activated or disabled with a binary control signal controlling a switch coupling the amplifier part to the operating voltage. This may be implemented in a way similar to that illustrated in FIG. 3 except for the complemented control signal CNTL applied to the gate electrode of the fifth amplifier transistor 328 being replaced by another binary control signal independent from that applied to the NOR gates 300 to 306. Outputs of the multiple parallel amplifier parts may then be combined in a combining circuit, or output ports may simply be connected to each other.

Figure 5:
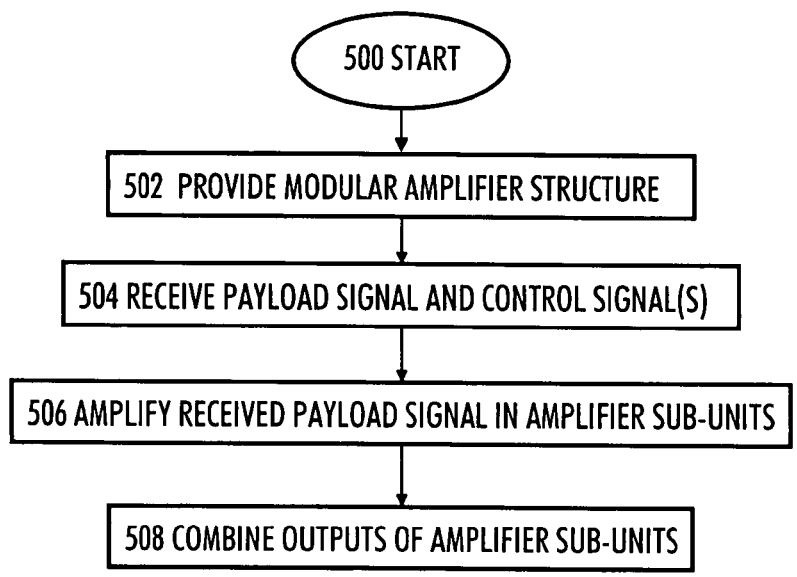
FIG. 5 is a flow diagram illustrating a method for amplifying a payload signal in an amplifier according to an embodiment of the invention.

FIG. 5 is a flow diagram illustrating a method for amplifying a payload signal in an amplifier according to an embodiment of the invention. The method may be carried out in a radio transmitter according to an embodiment of the invention. The radio transmitter may include the apparatus illustrated in FIGS. 2 and/or 3.

The method starts in block 500. In block 502, there is provided a modular amplifier structure including a plurality of amplifier sub-units. In block 504, a payload signal and at least one control signal are received at an input interface of the modular amplifier. The payload signal is a signal to be amplified in the modular amplifier structure under control of the at least one control signal. The control signals may be provided by a controller controlling the operation of the modular amplifier structure.

In block 506, the payload signal is amplified in each amplifier sub-unit under control of the at least one control signal. In fact, a different control signal may control each amplifier sub-unit. The at least one control signal provided by the controller may either activate or disable each amplifier sub-unit, thereby effectively controlling the amplification factor of the modular amplifier structure. Outputs of the amplifier sub-units are combined in a combining circuit in block 508. The combining circuit may be the resonator circuit described above.

The steps and related functions described above in FIG. 5 are in no absolute chronological order, and some of the steps may be performed simultaneously or in an order differing from the given one. Other functions may also be executed between the steps or within the steps. Some of the steps or part of the steps may also be replaced by a corresponding step or part of the step.

It will be obvious to a person skilled in the art that, as technology advances, the inventive concept can be implemented in various ways. The invention and its embodiments are not limited to the examples described above but may vary within the scope of the claims.

The invention claimed is:

1. An apparatus, comprising:
an interface configured to receive a payload signal and at least one control signal;
a modular amplifier structure comprising a plurality of parallel amplifier sub-units, wherein each amplifier sub-unit comprises a frequency converter and is configured to process the received payload signal under control of at least one of the received control signals; and
a combining circuit configured to combine outputs of the plurality of amplifier sub-units to provide an amplified payload signal, wherein the combining circuit is operationally coupled to the outputs of the plurality of the amplifier sub-units,
wherein each amplifier sub-unit is configured to be activated by coupling an oscillator signal to the amplifier sub-unit and disabled by preventing coupling of the oscillator signal to the amplifier sub-unit.

2. The apparatus of claim 1, wherein an output of the combining circuit is a superposition of the outputs of the amplifier sub-units.

3. The apparatus of claim 1, wherein the frequency converter is configured to convert the payload signal from a first frequency band to a second frequency band.

4. The apparatus according to claim 1, wherein the frequency converters are configured to process the payload signal from the same first frequency band to the same second frequency band.

5. The apparatus according to claim 1, wherein each amplifier sub-unit is configured to be activated or disabled with the at least one control signal, so as to control an output power of the modular amplifier structure.

6. The apparatus according to claim 1, wherein the at least one control signal is coupled to gates of transistors of the modular amplifier structure, and said transistors are configured to couple the payload signal to an output of the modular amplifier structure in response to the at least one control signal.

7. The apparatus according to claim 1, wherein the combining circuit includes a resonance circuit.

8. The apparatus according to claim 1, wherein the amplifier sub-units are configured to amplify the payload signal by different amplification factors.

9. The apparatus according to claim 1, wherein the amplification factor of at least part of the amplifier sub-units is controlled by binary weighting.

10. A radio transceiver, comprising:
a modular amplifier structure comprising a plurality of parallel amplifier sub-units, wherein each amplifier sub-unit comprises a frequency converter and is configured to process the received payload signal under control of received at least one control signal; and
a combining circuit configured to combine outputs of the plurality of amplifier sub-units to provide an amplified payload signal, wherein the combining circuit is operationally coupled to the outputs of the plurality of the amplifier sub-units,
wherein each amplifier sub-unit is configured to be activated by coupling an oscillator signal to the amplifier sub-unit and disabled by preventing coupling of the oscillator signal to the amplifier sub-unit.

11. A method, comprising:
receiving, in a modular amplifier structure, a payload signal and at least one control signal, wherein the modular amplifier structure comprises a plurality of parallel amplifier sub units, and each amplifier sub-unit comprises a frequency converter;
processing, in each amplifier sub-unit, the received payload signal under control of at least one of the received control signals;
combining outputs of a plurality of amplifier sub-units to provide an amplified payload signal, wherein a combining circuit is operationally coupled to the outputs of the plurality of the amplifier sub-units;
activating each amplifier sub-unit by coupling an oscillator signal to the amplifier sub-unit; and
disabling each amplifier sub-unit by preventing coupling of the oscillator signal to the amplifier sub-unit.

12. The method of claim 11, further comprising:
providing an output of the combining circuit as a superposition of the outputs of the amplifier sub-units.

13. The method of claim 11, further comprising:
converting the payload signal from a first frequency band to a second frequency band in each amplifier sub-unit in response to the at least one control signal applied to each amplifier sub-unit.

14. The method according to claim 11, further comprising:
processing the payload signal from the same first frequency band to the same second frequency band.

15. The method according to claim 11, further comprising:
selectively activating or disabling each amplifier sub-unit in response to the at least one control signal, so as to control an output power of the modular amplifier structure.

16. The method according to claim 11, further comprising:
coupling at least one control signal to gates of transistors of the modular amplifier structure; and
configuring said transistors to couple the payload signal to the output of the modular amplifier structure in response to the at least one control signal.

17. The method according to claim 11, further comprising:
arranging the combining circuit to include a resonance circuit.

18. The method according to claim 11, further comprising:
configuring the amplifier sub-units to amplify the payload signal by different amplification factors.

19. The method according to claim 11, further comprising:
controlling the amplification factor of at least part of the amplifier sub-units with binary weighting.

20. An apparatus, comprising:
modular amplifier means for amplifying comprising a plurality of parallel amplifier sub-unit means for amplifying, wherein each amplifier sub-unit means comprises frequency converter means for converting frequencies;
receiving means for receiving, in the modular amplifier means, a payload signal and at least one control signal;
processing means for processing, in each amplifier sub-unit means, the received payload signal under control of at least one of the received control signals; and
combining means for combining outputs of the plurality of amplifier sub-units to provide an amplified payload signal, wherein the combining means is operationally coupled to the outputs of the plurality of the amplifier sub-units;
activating each amplifier sub-unit by coupling an oscillator signal to the amplifier sub-unit; and
disabling each amplifier sub-unit by preventing coupling of the oscillator signal to the amplifier sub-unit.

21. A radio transceiver, comprising:
- modular amplifier means for amplifying comprising a plurality of parallel amplifier sub-unit means for amplifying, wherein each amplifier sub-unit means comprises frequency converter means for converting frequencies and processing means for processing a received payload signal under control of a received at least one control signal; and
- combining means for combining outputs of the plurality of amplifier sub-units to provide an amplified payload signal, wherein the combining means is operationally coupled to the outputs of the plurality of the amplifier sub-units,
- wherein each amplifier sub-unit means is activated by coupling an oscillator signal to the amplifier sub-unit means and disabled by preventing coupling of the oscillator signal to the amplifier sub-unit means.

\* \* \* \* \*